(12) United States Patent
Yoon et al.

(10) Patent No.: US 12,094,372 B2
(45) Date of Patent: **\*Sep. 17, 2024**

(54) DISPLAY DEVICE

(71) Applicant: LG Display Co., Ltd., Seoul (KR)

(72) Inventors: Sung Hwan Yoon, Paju-si (KR); Sun Geun Bae, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 176 days.

This patent is subject to a terminal disclaimer.

(21) Appl. No.: 17/778,241

(22) PCT Filed: Mar. 24, 2020

(86) PCT No.: PCT/KR2020/003983
§ 371 (c)(1),
(2) Date: May 19, 2022

(87) PCT Pub. No.: WO2021/100976
PCT Pub. Date: May 27, 2021

(65) Prior Publication Data
US 2023/0009971 A1   Jan. 12, 2023

(30) Foreign Application Priority Data
Nov. 20, 2019   (KR) .................. 10-2019-0149591

(51) Int. Cl.
*H05K 5/00*   (2006.01)
*G02F 1/1333*   (2006.01)
(Continued)

(52) U.S. Cl.
CPC ...... *G09F 9/3026* (2013.01); *G02F 1/133314* (2021.01); *G02F 1/133322* (2021.01);
(Continued)

(58) Field of Classification Search
CPC .................. H05K 5/0017; H05K 5/0217
(Continued)

(56) References Cited

U.S. PATENT DOCUMENTS 11,715,395 B2\* 8/2023 Yoon ................. G02F 1/133314
361/679.01
2005/0264985 A1\* 12/2005 Kim ......................... H05K 5/02
361/679.21
(Continued)

FOREIGN PATENT DOCUMENTS

CN   106463081 A   2/2017
CN   110246423 A   9/2019
(Continued)

*Primary Examiner* — Hung S. Bui
(74) *Attorney, Agent, or Firm* — Birch, Stewart, Kolasch & Birch, LLP

(57) ABSTRACT

A display device according to an exemplary embodiment of the present invention includes a display panel; a frame disposed on a rear surface of the display panel; a plurality of binders fixed to the rear surface of the display panel and disposed between the display panel and the frame; and a plurality of coupling members penetrating the frame and coupled to the plurality of binders. Accordingly, the display panel and the frame may be easily attached and detached using the plurality of binders and the plurality of coupling members.

23 Claims, 8 Drawing Sheets

(51) Int. Cl.
*G06F 1/16* (2006.01)
*G09F 9/302* (2006.01)
*H05K 5/02* (2006.01)
*H10K 59/18* (2023.01)

(52) U.S. Cl.
CPC ........ *G02F 1/13336* (2013.01); *G06F 1/1601* (2013.01); *H05K 5/0217* (2013.01); *H10K 59/18* (2023.02); *G02F 2201/07* (2013.01); *G02F 2201/46* (2013.01); *G02F 2201/48* (2013.01); *G02F 2202/28* (2013.01); *G06F 2200/1635* (2013.01); *H05K 5/0021* (2013.01)

(58) Field of Classification Search
USPC .......................................... 361/807, 809, 810
See application file for complete search history.

(56) References Cited

U.S. PATENT DOCUMENTS

| | | | |
|---|---|---|---|
| 2011/0019348 A1 | 1/2011 | Kludt et al. | |
| 2014/0075685 A1 | 3/2014 | Saveyn et al. | |
| 2016/0026030 A1* | 1/2016 | Kang | H05K 1/028 |
| | | | 361/749 |
| 2016/0165745 A1 | 6/2016 | Choi et al. | |
| 2019/0239384 A1 | 8/2019 | Heo et al. | |
| 2020/0193877 A1* | 6/2020 | Kim | G02F 1/133308 |
| 2021/0004192 A1* | 1/2021 | Kamiike | H05K 5/0217 |
| 2022/0187651 A1* | 6/2022 | Kang | G02F 1/133605 |
| 2023/0209749 A1* | 6/2023 | Park | H05K 5/0217 |
| | | | 361/731 |

FOREIGN PATENT DOCUMENTS

| | | | | |
|---|---|---|---|---|
| JP | 6345380 B1 * | 6/2018 | ............. | G09F 19/22 |
| JP | 6580294 B1 * | 9/2019 | ............. | G06F 3/1446 |
| JP | 6695507 B1 * | 5/2020 | ................ | G09F 9/00 |
| KR | 10-2004-0024376 A | 3/2004 | | |
| KR | 10-0537021 B1 | 2/2006 | | |
| KR | 10-2014-0035741 A | 3/2014 | | |
| KR | 10-2014-0067771 A | 6/2014 | | |
| KR | 20140067771 A * | 6/2014 | ........... | G09F 9/3026 |
| KR | 10-2015-0104485 A | 9/2015 | | |
| KR | 10-2019-0092968 A | 8/2019 | | |
| KR | 10-2021-0061947 A | 5/2021 | | |

* cited by examiner

DISPLAY DEVICE

CROSS REFERENCE TO RELATED APPLICATIONS

This application is the National Stage filing under 35 U.S.C. 371 of International Application No. PCT/KR2020/003983, filed on Mar. 24, 2020, which claims the benefit of earlier filing date and right of priority to Korean Application No. 10-2019-0149591, filed on Nov. 20, 2019, the contents of all these applications are hereby incorporated by reference herein in their entirety.

TECHNICAL FIELD

The present invention relates to a display device, and more particularly, to a display device having an improved flatness.

BACKGROUND ART

Display devices used in computer monitors, TVs, and mobile phones include organic light emitting displays (OLEDs) that emit light by themselves, and liquid crystal displays (LCDs) that require a separate light source.

Such display devices are being applied to more and more various fields including not only computer monitors and TVs, but also personal mobile devices, and thus, display devices having a reduced volume and weight while having a wide display area are being studied.

Recently, a tiling display device in which a plurality of display devices is connected to increase a display area is attached to a wall and the like to be used as a billboard and the like.

DISCLOSURE

Technical Problem

First, a display device is used from a small-size electronic apparatus used for mobile phones to a large-size electronic apparatus such as a large-size TV. As such, the display device is manufactured from a small size to a large size of tens of inches to be used for various purposes. However, it is technically difficult to manufacture a display device with a very large size of hundreds of inches or more. Therefore, a tiling display device in which a plurality of display devices is connected to increase a display area is used instead. Further, the tiling display device configured with a plurality of display devices is attached to a surface of a wall to be used as a billboard, a large electronic board at a stadium, an outdoor advertising signboard, or the like.

Such a tiling display device may be implemented, for example, by fastening display devices to a wall portion. Each of the display devices includes a display panel substantially without a bezel and a frame attached to the rear surface of the display panel to protect the display panel. However, if the frame has a low flatness, the flatness of the display panel attached to the frame is also decreased. Therefore, a step difference can be generated between a plurality of display devices fastened to the wall portion and the borders between the display devices can be visibly recognized.

Therefore, the frame and the display panel have been attached by using an elastic foam tape to compensate for the flatness of the display panel caused by a low flatness of the frame. The elastic foam tape can compensate for a decrease in flatness caused by foreign materials between the display panel and the frame or deformation of the frame. Here, only a flatness variation of less than the thickness of the foam tape has been considered as a defect to be compensated.

The foam tape has a plurality of pores therein and has a smaller adhesive force than other adhesive members. Thus, the foam tape needs a larger adhesive area than other adhesive members. Therefore, the foam tape was disposed on the entire surface of the frame to attach the display panel and the frame to each other. However, when the display panel and the frame are detached to repair or replace the display panel and/or the frame, a problem occurred in that it is difficult to remove the foam tape disposed on the entire surface of the frame. Further, the display panel and the frame can be damaged when detaching the display panel from the frame. Accordingly, if the display panel and the frame are attached with the foam tape for flatness compensation, a problem occurs in that it is difficult to detach the display panel and the frame when the display panel and the frame need to be repaired and replaced.

Therefore, the present inventors invented a display device in which the flatness of a display panel can be adjusted without being limited to the flatness of a frame and the display and the frame can be easily reassembled.

An object to be achieved by the present invention is to provide a display device having an improved flatness.

Another object to be achieved by the present invention is to provide a display device in which the flatness of a display panel is improved regardless of the flatness of a frame.

Yet another object to be achieved by the present invention is to provide a display device in which a display panel and a frame can be easily attached to and detached from each other.

Still another object to be achieved by the present invention is to provide a display device having an improved reliability of attachment between a display panel and a frame.

Still another object to be achieved by the present invention is to reduce a movement of a display panel in a space formed between the display panel and a frame when the frame has a low flatness.

Objects of the present invention are not limited to the above-mentioned objects, and other objects, which are not mentioned above, can be clearly understood by those skilled in the art from the following descriptions.

Technical Solution

A display device according to an exemplary embodiment of the present invention includes a display panel; a frame disposed on a rear surface of the display panel; a plurality of binders fixed to the rear surface of the display panel and disposed between the display panel and the frame; and a plurality of coupling members penetrating the frame and coupled to the plurality of binders. Accordingly, the display panel and the frame may be easily attached and detached using the plurality of binders and the plurality of coupling members.

A display device according to another exemplary embodiment of the present invention includes a display panel; a plurality of binders bonded to a rear surface of the display panel; an adhesive member which bonds the plurality of binders and the display panel; a frame disposed to cover the display panel and the plurality of binders; and a plurality of coupling members coupled to the frame and the plurality of binders, wherein lengths of parts of each of the plurality of coupling members in contact with the plurality of binders are different from each other. Therefore, the flatness of the display panel may be improved by adjusting a lengths of the plurality of coupling members to be inserted into the plurality of binders in view of the flatness of the frame.

Other matters of the exemplary embodiments are included in the detailed description and the drawings.

Advantageous Effects

According to the present invention, it is possible to easily adjust the flatness of the display panel without being limited to the degree of flatness of the frame.

According to the present invention, it is possible to easily reassemble the frame and the display panel.

According to the present invention, it is possible to improve the quality of adhesion between the display panel and the frame.

According to the present invention, it is possible to reduce a movement of the display panel in a space between the display panel and the frame.

The effects according to the present invention are not limited to the contents exemplified above, and more various effects are included in the present specification.

MODES OF THE INVENTION

Figure 1:
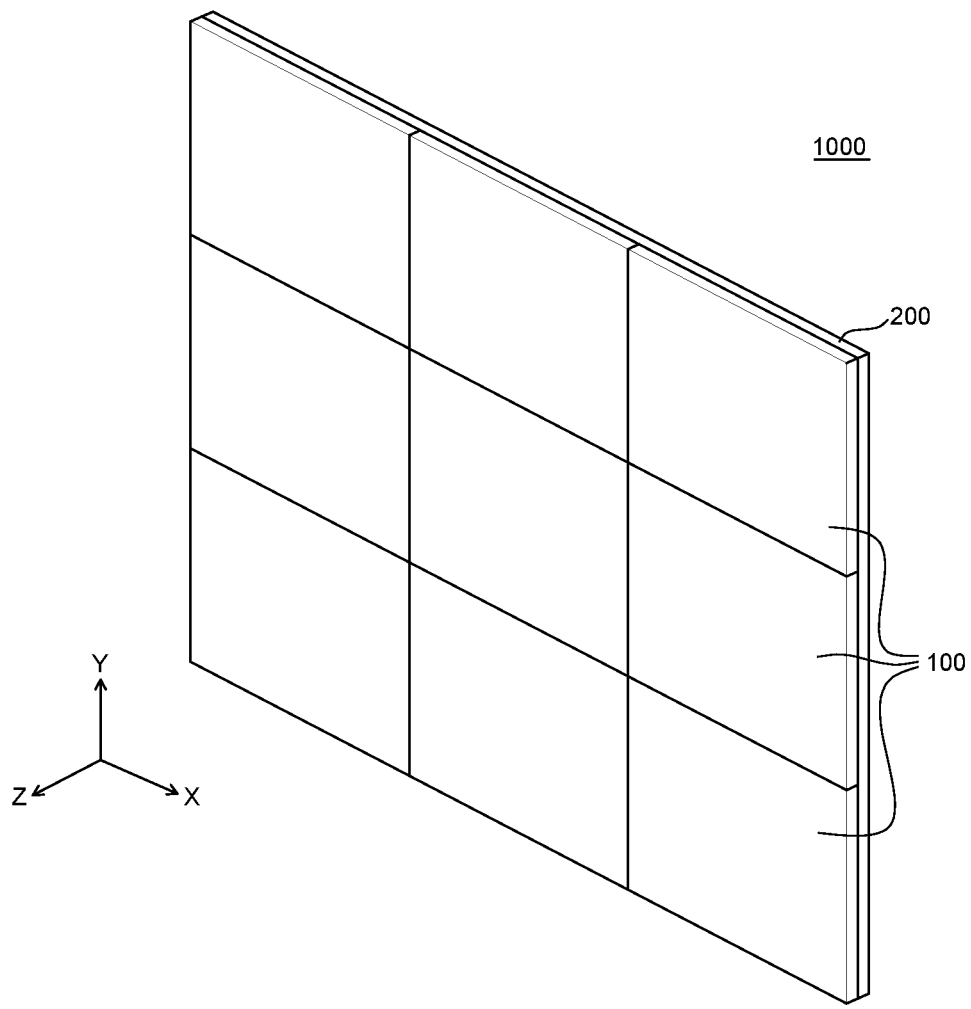
FIG. 1 is a perspective view of a tiling display device according to an exemplary embodiment of the present invention.

Advantages and characteristics of the present invention and a method of achieving the advantages and characteristics will be clear by referring to exemplary embodiments described below in detail together with the accompanying drawings. However, the present invention is not limited to the exemplary embodiments disclosed herein but will be implemented in various forms. The exemplary embodiments are provided by way of example only so that those skilled in the art can fully understand the disclosures of the present invention and the scope of the present invention. Therefore, the present invention will be defined only by the scope of the appended claims.

The shapes, sizes, ratios, angles, numbers, and the like illustrated in the accompanying drawings for describing the exemplary embodiments of the present invention are merely examples, and the present invention is not limited thereto. Like reference numerals generally denote like elements throughout the specification. Further, in the following description of the present invention, a detailed explanation of known related technologies may be omitted to avoid unnecessarily obscuring the subject matter of the present invention. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present invention.

Like reference numerals generally denote like elements throughout the specification.

A size and a thickness of each component illustrated in the drawing are illustrated for convenience of description, and the present invention is not limited to the size and the thickness of the component illustrated.

The features of various embodiments of the present invention can be partially or entirely adhered to or combined with each other and can be interlocked and operated in technically various ways, and the embodiments can be carried out independently of or in association with each other.

Hereinafter, the present invention will be described in detail with reference to the drawings.

FIG. 1 is a perspective view of a tiling display device according to an exemplary embodiment of the present invention. Referring to FIG. 1, a tiling display device 1000 according to an exemplary embodiment of the present invention is formed by connecting a plurality of display devices 100 according to an exemplary embodiment of the present invention.

Referring to FIG. 1, the tiling display device 1000 according to an exemplary embodiment of the present invention includes a plurality of display devices 100 and a wall portion 200. The tiling display device 1000 is composed of the plurality of display devices 100 and thus may increase a display area where images are displayed.

Each of the plurality of display devices 100 is attached to the wall portion 200 to be disposed as if it is a single display device. For example, the plurality of display devices 100 may be attached to the wall portion 200 in the form of tiles to implement the tiling display device 1000.

Since the tiling display device 1000 has a very large size, it is difficult to move the plurality of display devices 100 in a connected state to an installation location. Therefore, the plurality of display devices 100 may be moved to the installation location and then assembled into the tiling display device 1000 at the installation location.

The plurality of display devices 100 may be attached as close as possible such that the interval between the plurality of display devices 100 is constant and reduced. Therefore, the plurality of display devices 100 looks like a single display device 100. That is, the plurality of display devices 100 is precisely aligned to be attached to the wall portion 200 so that the borders where images are not displayed may be reduced.

In this case, the plurality of display devices 100 may be aligned in an X-axis direction, a Y-axis direction, and a Z-axis direction to be attached to the wall portion 200. When the plurality of display devices 100 is aligned in the X-axis direction, left edges and right edges of the plurality of display devices 100 disposed in the same columns, respectively, may be aligned straight. Further, when the plurality of display devices 100 is aligned in the Y-axis direction, upper edges and lower edges of the plurality of display devices 100 disposed in the same rows, respectively, may be aligned straight. Furthermore, when the plurality of display devices 100 is aligned in the Z-axis direction, all front surfaces of the plurality of display devices 100 may be aligned on a flat surface to remove a step difference between the plurality of display devices 100.

If the plurality of display devices 100 is misaligned in any one of the X-axis, Y-axis and Z-axis directions, the borders between the plurality of display devices 100 where images are not displayed may be visibly recognized by a user. When the borders are visibly recognized by the user, immersion may be inhibited when the user watches images and it may be difficult to display clear images.

Therefore, when the plurality of display devices 100 is attached to the wall portion 200, it is important to align the plurality of display devices 100 in each of the X-axis direction, the Y-axis direction, and the Z-axis direction. Further, when the plurality of display devices 100 is attached to the wall portion 200 using a fastening member, attachment locations of the plurality of display devices 100 may be primarily aligned. However, a minute misalignment between the plurality of display devices 100 may occur due to an error or a mechanism tolerance generated when an operator attaches the plurality of display devices 100. For example, if the locations of the plurality of display devices 100 in the Z-axis direction, i.e., the respective flatnesses of the plurality of display devices 100, are different from each other, the borders between the plurality of display devices 100 can be visibly recognized. Therefore, it may be important to improve the respective flatnesses of the plurality of display devices 100. Therefore, in the tiling display device 1000 according to an exemplary embodiment of the present invention, a plurality of binders BD is disposed in each display device 100 to improve the respective flatnesses of the plurality of display devices 100. Accordingly, it is possible to reduce an alignment error in the Z-axis direction.

Hereinafter, the display device 100 according to an exemplary embodiment of the present invention will be described in detail with reference to FIG. 2 through FIG. 4.

Figure 2:
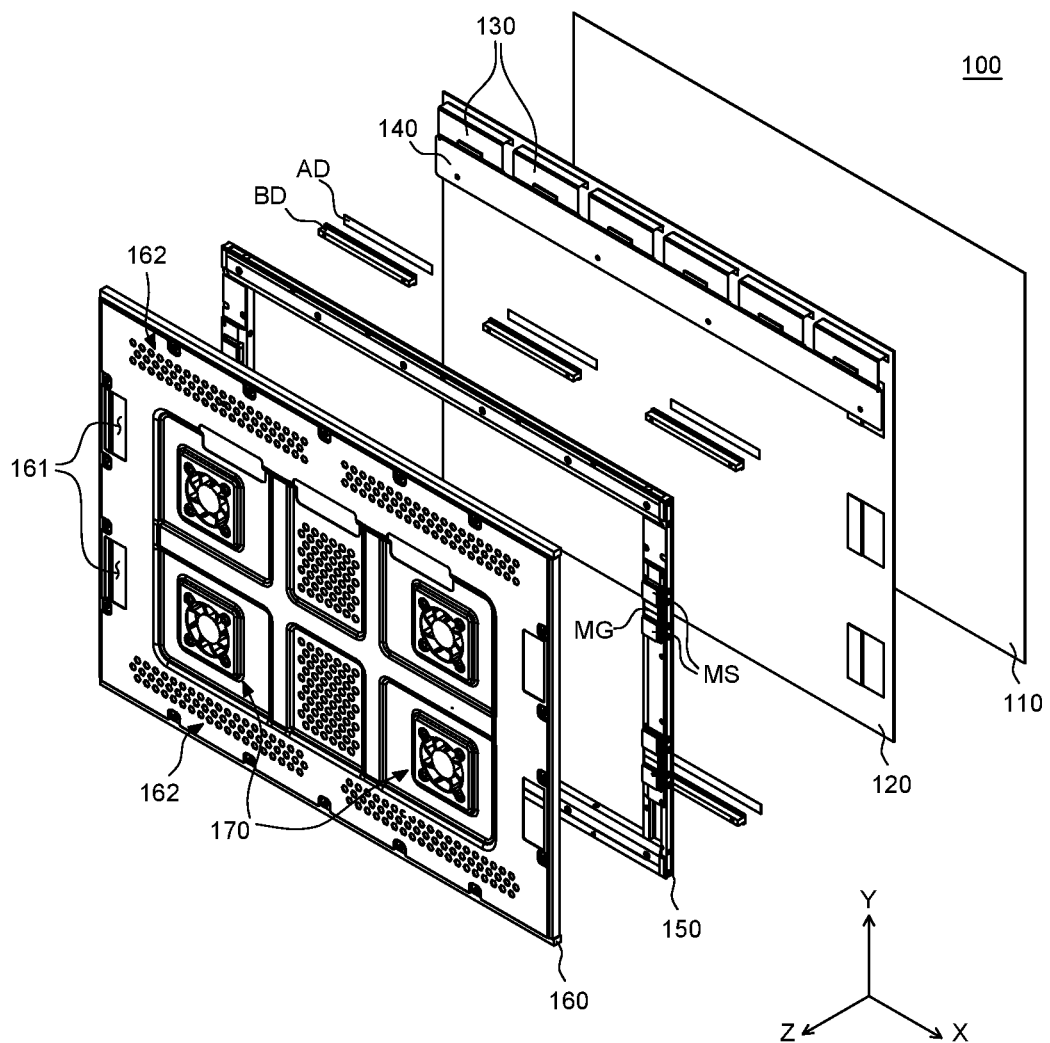
FIG. 2 is an exploded perspective view of the display device according to an exemplary embodiment of the present invention.

FIG. 2 is an exploded perspective view of the display device according to an exemplary embodiment of the present invention. FIG. 3 is an exploded perspective view of the display device according to an exemplary embodiment of the present invention. FIG. 4 is a rear view of the display device according to an exemplary embodiment of the present invention. Specifically, FIG. 2 is an exploded perspective view of the display device 100 as viewed from a rear surface of the display device 100. FIG. 3 is an exploded perspective view of the display device 100 as viewed from a front surface of the display device 100. FIG. 3 illustrates a frame 150, a plurality of binders BD, a plurality of coupling members SC, a plurality of adhesive members AD, a plurality of panel magnets MG and a plurality of panel ferromagnetic materials MS for the convenience of the description. FIG. 4 omits the illustration of a cover shield 160.

Referring to FIG. 2, the display device 100 includes a protection plate 110, a display panel 120, a plurality of flexible films 130, a printed circuit board 140, the frame 150, the cover shield 160, and a heat radiation fan 170. Also, the display device 100 includes the plurality of panel magnets MG, the plurality of panel ferromagnetic materials MS, the plurality of binders BD, and the plurality of adhesive members AD.

First, the display panel 120 is configured to display images to the user. In the display panel 120, display elements and circuits, wiring lines, components, and the like for driving the display elements may be disposed. The display elements may be defined in different ways depending on a type of the display panel 120. For example, when the display panel 120 is an organic light emitting display panel, the display element may be an organic light emitting diode including an anode, an organic emission layer, and a cathode. For example, when the display panel 120 is an inorganic light emitting display panel, the display element may be a light emitting diode (LED) or a micro LED including an n-type semiconductor layer, a p-type semiconductor layer, and an emission layer. However, the display panel 120 is not limited thereto and the display element of the display panel 120 may be configured in various forms.

The plurality of flexible films 130 is bonded to a rear surface of the display panel 120. The flexible film 130 may be a film in which various components are disposed on a base film having malleability. The flexible film 130 may supply a signal to the display elements and the circuits and may be electrically connected to the display panel 120. The plurality of flexible films 130 may supply a power voltage, a data voltage, or the like to the display panel 120. FIG. 2 illustrates six flexible films 130 bonded to a long side of the display panel 120. However, the number and locations of plurality of flexible films 130 may vary depending on the design and are not limited thereto. For example, two flexible films 130 may be bonded to a short side of the display panel 120. Alternatively, four flexible films 130 may be bonded to a long side of the display panel 120, while two flexible films 130 may be bonded to a short side of the display panel 120.

On the plurality of flexible films 130, driver ICs such as gate driver ICs or data driver ICs may be disposed. The driver ICs are configured to process data for displaying an image and a driving signal for processing the data. The driver ICs may be mounted in a Chip-On-Glass (COG) method, a Chip-On-Film (COF) method, a Tape-Carrier-Package (TCP) method, or the like depending on a mounting method. However, for the convenience of the description, the driver ICs are described as mounted on the plurality of flexible films 130 in the COF method, but the present invention is not limited thereto.

The printed circuit board 140 is electrically connected to the plurality of flexible films 130. The printed circuit board 140 is configured to supply signals to the driver ICs. On the printed circuit board 140, various components for supplying various signals, such as a drive signal or a data signal to the driver ICs may be disposed. FIG. 2 illustrates a single printed circuit board 140. However, the number of printed circuit boards 140 may vary depending on the design and is not limited thereto. For example, two or more printed circuit boards 140 could be provided.

The frame 150 is disposed on the rear surface of the display panel 120. The frame 150 on the rear surface of the display panel 120 may support and protect the display panel 120. The frame 150 may be made of a material having rigidity. For example, the frame 150 may be made of a metal material such as aluminum (Al), copper (Cu), zinc (Zn), silver (Ag), gold (Au), iron (Fe), Steel Use Stainless (SUS) or Invar, a plastic material, inorganic nonmetallic materials, or the like.

The frame 150 may have a shape corresponding to the edges of the display panel 120. For example, the frame 150 may have a frame shape corresponding to the edges of the display panel 120. The frame 150 may support edges of the display panel 120 to maintain the flatness of the display panel 120. Alternatively, the frame 150 may have the same shape as a flat surface shape of the display panel 120, and the shape of the frame 150 is not limited thereto as long as it can support the display panel 120. For example, the frame 150 may have a shape not corresponding to the edges of the display panel 120.

Figure 3:
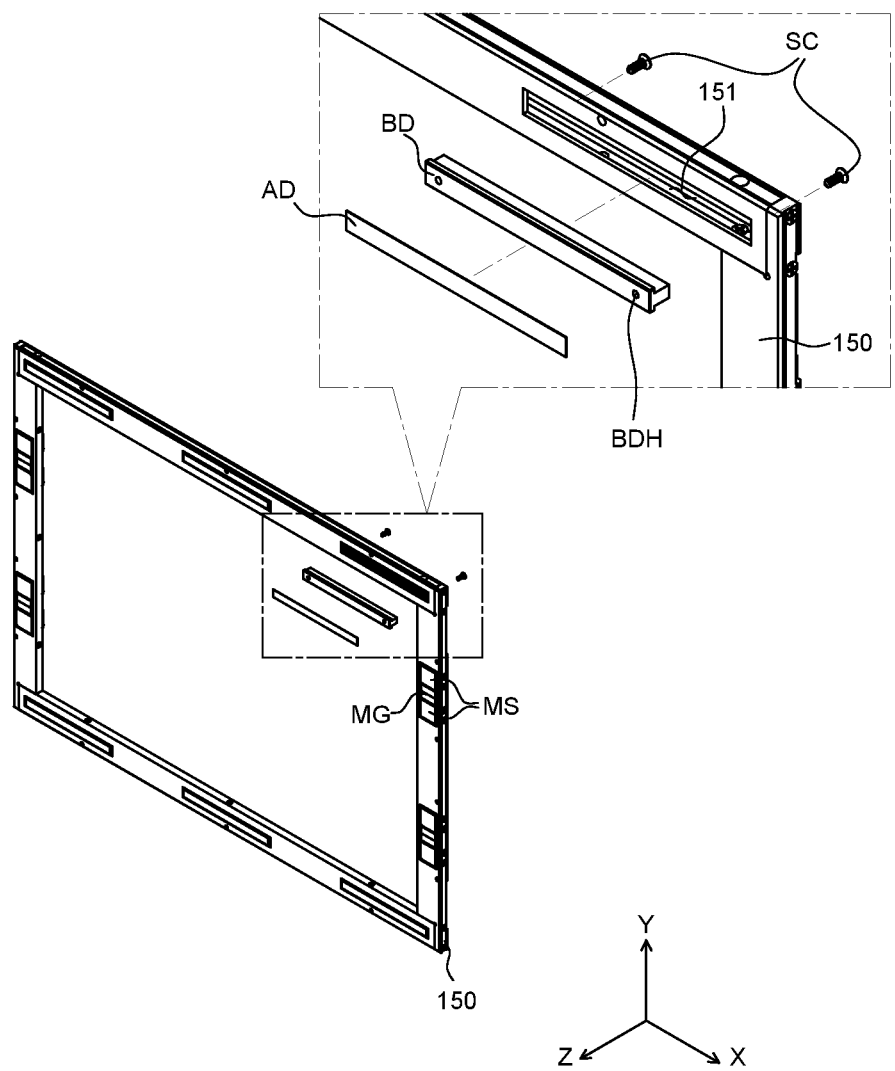
FIG. 3 is an exploded perspective view of the display device according to an exemplary embodiment of the present invention.

Referring to FIG. 2 and FIG. 3, the frame 150 includes a plurality of grooves 151.

The plurality of binders BD is mounted on the plurality of grooves 151, respectively. The plurality of grooves 151 may be formed in one surface of the frame 150 facing the display panel 120, and the plurality of binders BD may be inserted into the plurality of grooves 151. The plurality of grooves 151 is disposed in the frame 150 having a shape corresponding to the edges of the display panel 120 and thus may overlap the display panel 120 in the vicinity of the edges. In the drawings, three grooves 151 are illustrated as disposed at each of an upper end and a lower end of the frame 150, respectively, but the number and locations of plurality of grooves 151 are not limited thereto. For example five grooves may be disposed at only an upper end of the frame 150. Alternatively, five grooves may be disposed at an upper end of the frame 150, while two grooves may be disposed at a lower end of the frame 150. Alternatively, at least two grooves may be disposed at each of a left end and a right end of the frame 150.

Meanwhile, the frame 150 further includes a plurality of coupling holes formed in bottom surfaces of the plurality of grooves 151 to allow the plurality of coupling members SC to penetrate therethrough. This will be described in detail with reference to FIG. 5A and FIG. 5B.

Referring to FIG. 2 and FIG. 3, the plurality of binders BD is disposed between the display panel 120 and the frame 150. The plurality of binders BD is configured to couple the display panel 120 and the frame 150. Also, the plurality of binders BD is configured to adjust the flatness of the display panel 120.

The plurality of binders BD may be disposed along the edges of the display panel 120. Long sides of the plurality of binders BD may be disposed along the edges of the display panel 120. The long sides of the plurality of binders BD may be disposed in parallel to the most adjacent edge of the display panel 120. For example, the long side of the binder BD disposed adjacent to the upper edge of the display panel 120 may be disposed in parallel to the upper edge of the display panel 120. If the long sides of the plurality of binders BD are disposed along the edges of the display panel 120, the flatness of the display panel 120 may be more easily adjusted. The adjustment of the flatness of the display panel 120 by the plurality of binders BD will be described in more detail with reference to FIG. 5A and FIG. 5B.

In the drawings, three binders BD are illustrated as disposed adjacent to the upper edge of the display panel 120 and three binders BD are illustrated as disposed adjacent to the lower edge of the display panel 120. However, the plurality of binders BD may be disposed at the left edge and the right edge of the display panel 120, and the number and locations of plurality of binders BD are not limited thereto. For example, a number of the binders BD could be different from a number of the grooves 151. For example, a number of the binders BD could be smaller than a number of the grooves 151. For example, display panels at different positions could have different number of the binders.

The plurality of binders BD includes fixing holes BDH to be coupled to the plurality of coupling members SC. The plurality of binders BD may be inserted into the plurality of grooves 151 of the frame 150 so as to be coupled to the plurality of coupling members SC. The plurality of binders BD may be mounted inside the plurality of grooves 151 so as to be coupled to the plurality of coupling members SC. The fixing holes BDH are configured for coupling to the plurality of coupling members SC and may be formed in one surface of the binders BD facing the bottom surfaces of the plurality of grooves 151. The fixing holes BDH may be disposed corresponding to the plurality of coupling holes of the frame 150.

The plurality of coupling members SC penetrating through the plurality of coupling holes may be disposed on a rear surface of the frame 150. The plurality of coupling members SC may be coupled to the plurality of binders BD with the frame 150 interposed therebetween. Here, the plurality of coupling members SC may be inserted into the fixing holes BDH of the plurality of binders BD so as to be coupled to the plurality of binders BD.

For example, the plurality of coupling members SC may be screws with threads. Also, the fixing holes BDH of the plurality of binders BD into which the plurality of coupling members SC is inserted may be holes with screw threads on the inner circumferential surface. In this case, the head of the coupling member SC is disposed on the rear surface of the frame 150, and at least a part of the screw thread may be inserted into the fixing hole BDH inside the plurality of grooves 151. Although the plurality of coupling members SC is illustrated as screws in the drawings, the type of the plurality of coupling members SC is not limited thereto. For example, the plurality of coupling members SC could be a bolt a stud, etc. Hereinafter, for the convenience of the description, it will be assumed that the plurality of coupling members SC is screws with threads and the fixing holes BDH of the binders BD are holes with screw threads on the inner circumferential surface. However, the present disclosure is not limited thereto.

If the coupling member SC with a screw thread is inserted into the fixing hole BDH and rotated in any one of a clockwise direction and a counter-clockwise direction, the coupling member SC may be rotated at the same spot. Also, the binder BD may be moved along the screw thread of the coupling member SC in a direction to be separated from the coupling member SC. That is, if the coupling member SC is rotated in one direction, the binder BD is moved along the screw thread of the coupling member SC. Therefore, the binder BD may be moved to the outside of the plurality of grooves 151 and toward the display panel 120 and may be finally separated from a coupling member SC.

On the contrary, if the coupling member SC is rotated in the other of the clockwise direction and the counter-clockwise direction, the coupling member SC may be rotated at the same spot. Also, the binder BD may be moved along the screw thread of the coupling member SC in a direction to be coupled to the coupling member SC. That is, if the coupling member SC is rotated in the other direction, the binder BD is moved along the screw thread of the coupling member SC. Therefore, the binder BD may be moved to the inside of the plurality of grooves 151 and toward the frame 150 and may be finally coupled as much as possible to the screw thread of the coupling member SC. Accordingly, the coupling members SC are rotated in the clockwise direction or the counterclockwise direction to adjust outer surfaces of the plurality of binders BD to be disposed on the same flat surface.

The plurality of adhesive members AD is disposed between the plurality of binders BD and the display panel 120. The adhesive members AD may be made of an adhesive material to fix the binders BD to the rear surface of the display panel 120. For example, the adhesive members AD may be adhesive acrylic double-sided tapes, but are not limited thereto.

The plurality of panel magnets MG is disposed on the rear surface of the display panel 120. The plurality of panel magnets MG on the rear surface of the display panel 120 may be fixed to the rear surface of the frame 150. The plurality of panel magnets MG is disposed on the rear surface of the display panel 120 and used for attaching the display device 100 to the wall portion 200. For example, each of the plurality of panel magnets MG may be a bar-type magnet having one N pole and one S pole, but is not limited thereto. Here, the plurality of panel magnets MG may be fixed to the frame 150 using the adhesive members or other fastening members, but is not limited thereto.

The plurality of panel ferromagnetic materials MS is disposed on the rear surface of the display panel 120. The plurality of panel ferromagnetic materials MS on the rear surface of the display panel 120 may be fixed to the rear surface of the frame 150. The plurality of panel ferromagnetic materials MS may be disposed on both side surfaces of each of the plurality of panel magnets MG. Each of the plurality of panel magnets MG may be disposed between the plurality of panel ferromagnetic materials MS. For example, one of the plurality of panel ferromagnetic materials MS may be in contact with the N pole of the panel magnet MG and another panel ferromagnetic material MS may be in contact with the S pole of the panel magnet MG. Each of the plurality of panel magnets MG may be disposed between two panel ferromagnetic materials MS. The plurality of panel ferromagnetic materials MS may be made of a ferromagnetic material, for example, steel, but is not limited thereto.

The display device 100 may be attached to the wall portion 200 using the plurality of panel magnets MG and the plurality of panel ferromagnetic materials MS. For example, when the display device 100 is brought into contact with the wall portion 200, magnetic lines of force are induced among the wall portion 200, the panel magnets MG and the panel ferromagnetic materials MS. Thus, the display device 100 may be fixed to the wall portion 200. Here, the display device 100 may also be attached to the wall portion 200 using only the plurality of panel magnets MG without the plurality of panel ferromagnetic materials MS. The method of attaching the display device 100 to the wall portion 200 using the plurality of panel magnets MG and the plurality of panel ferromagnetic materials MS is just an example. Instead of the plurality of panel magnets MG and the plurality of panel ferromagnetic materials MS, other fastening members may be disposed. However, the present invention is not limited thereto.

Figure 4:
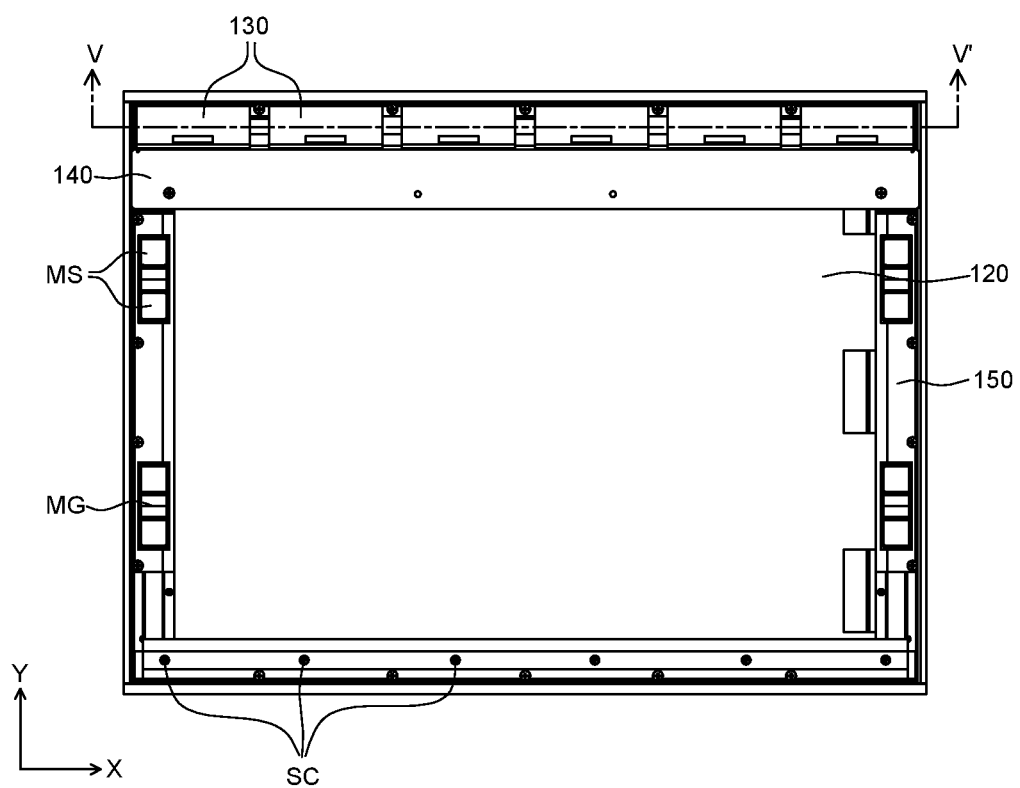
FIG. 4 is a rear view of the display device according to an exemplary embodiment of the present invention.

Referring to FIG. 2 and FIG. 4, the cover shield 160 is disposed on the rear surface of the frame 150. The cover shield 160 on the rear surface of the frame 150 may cover the plurality of flexible films 130 and the printed circuit board 140. Specifically, the plurality of flexible films 130 is bonded to the rear surface of the display panel 120. Further, the frame 150 on the rear surface of the display panel 120 may be coupled to the display panel 120 using the binders BD. Here, the plurality of flexible films 130 and the printed circuit board 140 are not disposed between the display panel 120 and the frame 150, but disposed to cover the frame 150. Each of the plurality of flexible films 130 is a film in which various components are disposed on a base film having malleability as described above and thus can be easily bent. Therefore, the plurality of flexible films 130 is bent to cover the frame 150 so that the plurality of flexible films 130 and the printed circuit board 140 are disposed on the display panel 120 and the frame 150.

The cover shield 160 is disposed to cover the display panel 120, the plurality of flexible films 130, the printed circuit board 140 and the frame 150. Specifically, the frame 150 does not cover the plurality of flexible films 130 and the printed circuit board 140. Thus, it may be difficult to protect the plurality of flexible films 130 and the printed circuit board 140 against external impacts. Accordingly, the cover shield 160 may be disposed on the rear surface of the frame 150 to protect the plurality of flexible films 130 and the printed circuit board 140. The cover shield 160 is disposed to cover the display panel 120, the plurality of flexible films 130, the printed circuit board 140 and the frame 150. Thus, the cover shield 160 may protect the other components of the display device 100, particularly, the plurality of flexible films 130 and the printed circuit board 140.

The cover shield 160 includes a plurality of first holes 161 that exposes the plurality of panel magnets MG and the plurality of panel ferromagnetic materials MS and a plurality of second holes 162 for heat radiation.

Referring to FIG. 2, the plurality of first holes 161 exposes the plurality of panel magnets MG and the plurality of panel ferromagnetic materials MS fixed to the rear surface of the frame 150. The plurality of panel magnets MG and the plurality of panel ferromagnetic materials MS exposed through the plurality of first holes 161 may be brought into closer contact with the wall portion 200, and the intensity of magnetic lines of force may increase. If the plurality of panel magnets MG and the plurality of panel ferromagnetic materials MS are covered by the cover shield 160, the cover shield 160 may increase the interval between the wall portion 200 and the plurality of panel magnets MG and the plurality of panel ferromagnetic materials MS. Thus, the intensity of magnetic lines of force may decrease and the display device 100 may be detached from the wall portion 200. Accordingly, the plurality of first holes 161 may be disposed such that the plurality of panel magnets MG and the plurality of panel ferromagnetic materials MS are disposed adjacent to the wall portion 200. Therefore, it is possible to securely attach the display device 100 to the wall portion 200.

The plurality of second holes 162 may be disposed to overlap at least the flexible films 130 and the printed circuit board 140. The plurality of second holes 162 is configured to radiate heat generated from the display device 100 when the display device 100 is driven. Here, the plurality of second holes 162 is disposed to overlap at least the flexible films 130 and the printed circuit board 140 which have high heat generation. Thus, it is possible to effectively radiate heat generated from the display device 100. FIG. 2 illustrates that the plurality of second holes 162 is disposed on an upper side of the cover shield 160, a lower side of the cover shield 160 and a central portion of the cover shield 160. However, the locations of the plurality of second holes 162 are not limited thereto. For example, the plurality of second holes 162 could be disposed only at positions overlapping the flexible films 130 and the printed circuit board 140.

The heat radiation fan 170 may be disposed on the rear surface of the display panel 120. The heat radiation fan 170 may circulate air between the cover shield 160 and the display panel 120 to radiate heat generated when the display device 100 is driven. The heat radiation fan 170 may be used to convect air inside the display device 100 and thus radiate heat from the display device 100. Here, the air may be introduced and discharged through the heat radiation fan 170 and the plurality of second holes 162 of the cover shield 160. FIG. 2 illustrates four heat radiation fans 170. However, the heat radiation fan 170 may be omitted depending on the design, and the number and locations of heat radiation fans 170 are not limited thereto.

The protection plate 110 is disposed to cover a front surface of the display panel 120. The protection plate 110 may be disposed to cover the display panel 120 so as to protect the display panel 120 against external impacts, moisture, heat, and the like. The protection plate 110 may be made of a material having impact resistance and light transmittance. For example, the protection plate 110 may be a substrate made of glass. Also, the protection plate 110 may be a thin film made of a plastic material such as polycarbonate (PC), polyimide (PI), polymethylmethacrylate (PMMA) and polyethylene terephthalate (PET), but is not limited thereto.

As described above, the display panel 120 may be coupled to the frame 150 using the plurality of binders BD and the plurality of coupling members SC. The frame 150 may be made of a rigid material such as metal to support the display panel 120. If the frame 150 is made of a metal material, the frame 150 may be manufactured by extrusion or the like. However, the flatness of the frame 150 may be different from a design value due to various tolerances in manufacturing of the frame 150. For example, a plurality of corners of the frame 150 are located at different locations in the Z-axis direction and thus may be disposed on different XY planes. When the frame 150 has a low flatness, the flatness of the display panel 120 fixed to the frame 150 may vary due to influence of the flatness of the frame 150. For example, if the display panel 120 is fixed to the frame 150 whose one of the plurality of corners is disposed on a different XY plane from another corner, one of the corners of the display panel 120 may also be disposed on a different XY plane from another corner. Therefore, the edges of the display panel 120 may not be disposed on the same plane, and the flatness of the display panel 120 may be decreased.

Then, if the tiling display device 1000 is implemented by aligning the display device 100 on the wall portion 200, a step difference may be generated between the plurality of display devices 100 in the Z-axis direction. Thus, the borders between the plurality of display devices 100 can be visibly recognized. That is, a step difference may be generated between the edges of the display devices 100, and, thus, the borders can be visibly recognized. In the display device 100 according to an exemplary embodiment of the present invention, the flatness of the display panel 120 may be improved using the plurality of binders BD and the plurality of coupling members SC regardless of the flatness of the frame 150.

Hereinafter, the adjustment of the flatness of the display panel 120, i.e., a Z-axial step difference, using the plurality of binders BD and the coupling members SC will be described with reference to FIG. 5A and FIG. 5B.

Figure 5A:
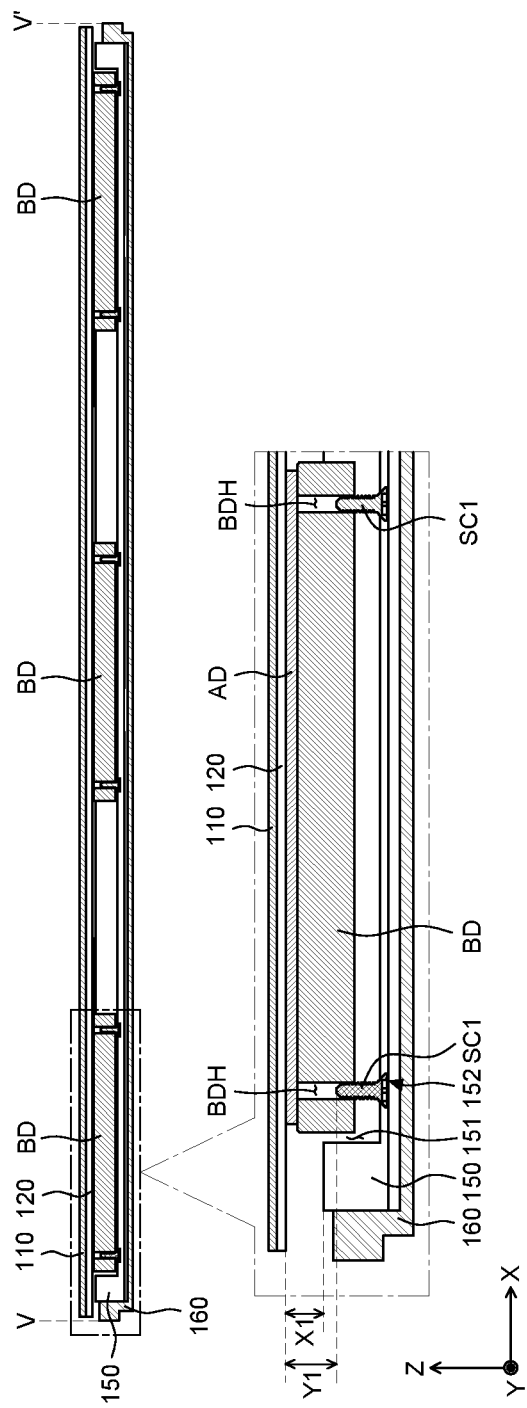
FIG. 5A and FIG. 5B are cross-sectional views taken along the line V-V' of FIG. 4.
Figure 5B:
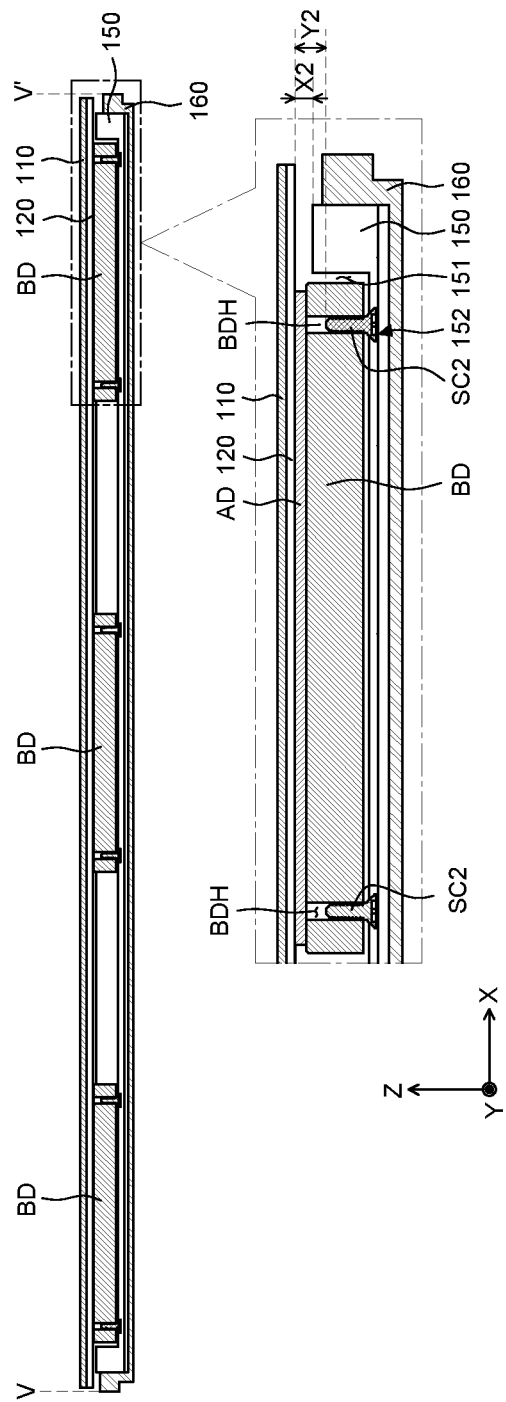

FIG. 5A and FIG. 5B are cross-sectional views taken along the line V-V' of FIG. 4. Specifically, FIG. 5A shows a cross-sectional view of the display device 100 according to an exemplary embodiment of the present invention and an enlarged view of a first coupling member SC1 among the plurality of coupling members SC. FIG. 5B shows a cross-sectional view of the display device 100 according to an exemplary embodiment of the present invention and an enlarged view of a second coupling member SC2 among the plurality of coupling members SC. For the convenience of the description, FIG. 5A and FIG. 5B omit the illustration of the cross sections of the plurality of flexible films 130 and the printed circuit board 140.

Hereinafter, for the convenience of the description, one of the plurality of coupling members SC disposed in an area where the interval between the display panel 120 and the frame 150 is the greatest is defined as the first coupling member SC1. Also, one of the plurality of coupling members SC disposed in an area where the interval between the display panel 120 and the frame 150 is smallest is defined as the second coupling member SC2. However, this is just an example and the present invention is not limited thereto.

Referring to FIG. 5A and FIG. 5B, the frame 150 includes a plurality of coupling holes 152. The plurality of coupling holes 152 is formed in the bottom surfaces of the plurality of grooves 151 and may communicate with the plurality of grooves 151. The plurality of coupling members SC may penetrate through the plurality of coupling holes 152. The plurality of coupling members SC may be connected to the fixing holes BDH of the binders BD inserted into the plurality of grooves 151 through the plurality of coupling holes 152.

Here, the plurality of coupling holes 152 may have a smaller size than the heads of the plurality of coupling members SC to allow only the screw threads of the plurality of coupling members SC to penetrate therethrough. If the plurality of coupling holes 152 has a greater size than the heads of the plurality of coupling members SC, the heads of the plurality of coupling members SC may not be fixed to the rear surface of the frame 150. Also, the binders BD and the plurality of coupling members SC may be separated from the frame 150. Therefore, the plurality of coupling holes 152 may have a smaller size than the heads of the plurality of coupling members SC to fix the frame 150 and the display panel 120.

The plurality of coupling members SC may be inserted to different depths into the fixing holes BDH of the binders BD, respectively. For example, a portion of the frame 150 where the first coupling member SC1 among the plurality of coupling members SC is disposed may be disposed on a different plane from another portion of the frame 150 where the second coupling member SC2 is disposed. That is, if the frame 150 has a low flatness, one surface of the frame 150 may not be disposed on the same plane. For example, an interval X1 between a part of the frame 150 where the first coupling member SC1 is disposed and the display panel 120 may be greatest. Also, an interval X2 between the other part of the frame 150 where the second coupling member SC2 is disposed and the display panel 120 may be smallest. If the frame 150 and the display panel 120 are attached to each other without using the binders BD and the coupling members SC, the edges of the display panel 120 may be deformed so as to correspond to edges of the frame 150. Therefore, the flatness may be decreased.

Referring to FIG. 5A, the first coupling member SC1 among the plurality of coupling members SC may be the coupling member SC having the largest interval Y1 with the display panel 120. In other words, the first coupling member SC1 may be a coupling member SC disposed in the portion where the interval X1 between the frame 150 and the display panel 120 is greatest. Specifically, the head of each of the plurality of coupling members SC is in contact with the rear surface of the frame 150. Thus, the intervals between the plurality of coupling members SC and the display panel 120 may be influenced by the flatness of the frame 150. Accordingly, the interval Y1 between the first coupling member SC1 and the display panel 120 may be the greatest in an area where the interval X1 between the frame 150 and the display panel 120 is greatest. In this case, the first coupling member SC1 may be inserted to a minimum depth into the fixing hole BDH, and the binder BD coupled to the first coupling member SC1 may be protruded to the outside of the plurality of grooves 151.

In the area where the interval X1 between the frame 150 and the display panel 120 is greatest, a part of the first coupling member SC1 inserted into the binder BD may have a smallest length. As the length of the part of the first coupling member SC1 inserted into the binder BD increases, the binder BD may be disposed to be more adjacent to the bottom surfaces of the plurality of grooves 151. On the contrary, as the length of the part of the first coupling member SC1 inserted into the binder BD decreases, the binder BD may become farther away from the bottom surfaces of the plurality of grooves 151. Further, the binder BD may be protruded to the outside of the plurality of grooves 151. In the area where the interval X1 between the frame 150 and the display panel 120 is greatest, the part of the first coupling member SC1 inserted into the binder BD may be designed to have a smallest length. Thus, the binder BD may be protruded to the outside of the groove 151 and an outer side surface of the binder BD may be disposed on the same plane as outer side surfaces of the other binders BD. Therefore, even if the frame 150 has a low flatness, the flatness of the display panel 120 fixed to the binders BD may be compensated for by adjusting the lengths of parts of the coupling members SC to be inserted into the binders BD.

Referring to FIG. 5B, the second coupling member SC2 among the plurality of coupling members SC may be the coupling member SC having the smallest interval Y2 with the display panel 120. In other words, the second coupling member SC2 may be a coupling member SC disposed in the portion where the interval X2 between the frame 150 and the display panel 120 is smallest. As described above, the head of each of the plurality of coupling members SC is disposed on the rear surface of the frame 150. Thus, the interval Y2 between each of the plurality of coupling members SC and the display panel 120 may be influenced by the flatness of the frame 150. Accordingly, the interval Y2 between the second coupling member SC2 and the display panel 120 may be smallest in an area where the interval X2 between the frame 150 and the display panel 120 is smallest. In this case, the second coupling member SC2 may be inserted to a maximum depth into the fixing hole BDH. Also, the binder BD coupled to the second coupling member SC2 may be disposed to be most adjacent to the bottom surfaces of the plurality of grooves 151, compared to the other binders BD.

In the area where the interval X2 between the frame 150 and the display panel 120 is smallest, a part of the second coupling member SC2 inserted into the binder BD may have the greatest length. In the area where the interval X2 between the frame 150 and the display panel 120 is smallest, the part of the second coupling member SC2 inserted into the binder BD is designed to have the greatest length. Thus, the binder BD may be mounted inside the groove 151 and an outer side surface of the binder BD may be disposed on the same plane as outer side surfaces of the other binders BD. Therefore, even if the frame 150 has a low flatness, the flatness of the display panel 120 fixed to the binders BD may be compensated for by adjusting the lengths of parts of the coupling members SC to be inserted into the binders BD.

Meanwhile, the plurality of binders BD may be disposed along the edge of the display panel 120, i.e., the long sides of the plurality of binders BD are disposed corresponding to the edge of the display panel 120. Thus, the flatness of the display panel 120 may be more easily adjusted. In the tiling display device 1000, if there is a step difference between the edges of adjacent display panels 120, the border may be visibly recognized. Accordingly, it is important to remove a step difference between the edges of a plurality of display panels 120. Therefore, the plurality of binders BD is disposed along the edges of the display panel 120 so that a Z-axial step difference at the edges of the display panels 120 may be easily adjusted. If the plurality of binders BD is disposed to be more adjacent to a central portion of the display panel 120 than to the edges of the display panel 120, it may be difficult to adjust the Z-axial step difference at the edges of the display panels 120 even using the binders BD. Therefore, the plurality of binders BD is disposed along the edges of the display panel 120, and, thus, it is possible to improve adjustment of the flatness of the display panel 120 using the plurality of binders BD.

Conventionally, since a display panel is attached to a frame whose entire surface is coated with an adhesive member, the flatness of the display panel may vary depending on the flatness of the frame. Accordingly, the display panel may be attached to the frame using a foam tape in order to compensate for a decrease in the flatness of the display panel caused by the flatness of the frame. If the frame is deformed or foreign materials are present between the display panel and the frame, the flatness of the display panel may vary, but the elastic foam tape is deformed instead of the display panel. Thus, a flatness variation of the display panel may be reduced. However, the flatness of the display panel may be compensated for within the range of the thickness or less of the foam tape. Therefore, the foam tape is limited in compensating for the flatness of the display panel. In order to compensate for the flatness of the display panel, it has been contemplated to increase the flatness of the frame instead of using the foam tape that can compensate only for a deformation of the thickness or less. However, an increase in the flatness of the frame results in an increase in manufacturing cost.

In the display device 100 according to an exemplary embodiment of the present invention, the plurality of binders BD is disposed between the display panel 120 and the frame 150. Thus, it is possible to minimize an increase in manufacturing cost and easily improve the flatness of the display panel 120. Specifically, if the frame 150 disposed on the rear surface of the display panel 120 to support the edges of the display panel 120 has a low flatness, the flatness of the edges of the display panel 120 may also be decreased. In this case, the plurality of binders BD is disposed between the display panel 120 and the frame 150 and the lengths of the coupling members SC to be inserted into the plurality of binders BD may be adjusted. Thus, the flatness of the display panel 120 may be improved. The plurality of coupling members SC may penetrate through the coupling holes 152 of the frame 150 from the rear surface of the frame 150 and then may be inserted into the fixing holes BDH of the binders BD between the frame 150 and the display panel 120. Then, the plurality of coupling members SC inserted into the fixing holes BDH of the plurality of binders BD may be rotated in the clockwise direction or the counter-clockwise direction. In this case, the plurality of binders BD may be moved toward the inside or outside of the plurality of grooves 151 along the screw threads on inner circumferential surfaces of the fixing holes BDH. Accordingly, by rotating the plurality of coupling members SC, the locations of the plurality of binders BD may be adjusted in the Z-axis direction. Also, the location of a part of the display panel 120 bonded to the plurality of binders BD may be adjusted in the Z-axis direction. Therefore, in the display device 100 according to an exemplary embodiment of the present invention, the plurality of binders BD which is movable in the Z-axis direction is disposed between the display panel 120 and the frame 150. Thus, it is possible to easily adjust the flatness of the display panel 120 regardless of the flatness of the frame 150.

Meanwhile, in order to attach the display panel to the frame, the foam tape is disposed on the entire surface of the frame to attach the display panel to the frame. However, when the display panel needs to be separated from the frame due to a defective assembly of the display panel and the frame, it is difficult to remove the adhesive member coated on the entire surface of the frame. Also, the display panel and the frame may be damaged in the process of separating the display panel and the frame.

Therefore, in the display device 100 according to an exemplary embodiment of the present invention, the display panel 120 and the frame 150 are assembled by screw coupling. Thus, the display panel 120 and the frame 150 may be easily attached to and detached from each other. Specifically, the display panel 120 and the plurality of binders BD are bonded to each other using the adhesive members AD. Further, the plurality of binders BD to which the display panel 120 is bonded may be coupled to the frame 150 using the plurality of coupling members SC. The plurality of coupling members SC and the plurality of binders BD may be coupled to or separated from each other by screw coupling. Accordingly, the plurality of binders BD may be easily separated from the plurality of coupling members SC, and the display panel 120 may also be easily separated from the frame 150. Therefore, the display panel 120 and the frame 150 are attached to and detached from each other using the plurality of binders BD and the plurality of coupling members SC which are screw-coupled to each other. Thus, it is possible to reduce damage to the display panel 120 and the frame 150 during disassembly and reassembly of the display panel 120 and the frame 150. Also, it is possible to easily reassemble the display panel 120 and the frame 150.

Further, since the flatness of the display panel 120 is compensated for by using the coupling members SC and the binders BD, the adhesive members AD are not limited to the foam tape for flatness compensation and may employ various types of adhesive members AD. The foam tape may compensate for flatness, but needs to have a larger adhesive area and a stronger adhesive force than other adhesive members. Meanwhile, in the display device 100 according to an exemplary embodiment of the present invention, the foam tape is not used to adjust flatness. Thus, an adhesive member AD having a larger adhesive area and a greater adhesive force may be used. For example, the adhesive members AD may be acrylic double-sided tapes and may have an improved adhesive area and adhesive force compared to the foam tape. Therefore, it is possible to improve the quality of adhesion of the display panel 120 bonded to the plurality of binders BD using the adhesive members AD.

Figure 6:
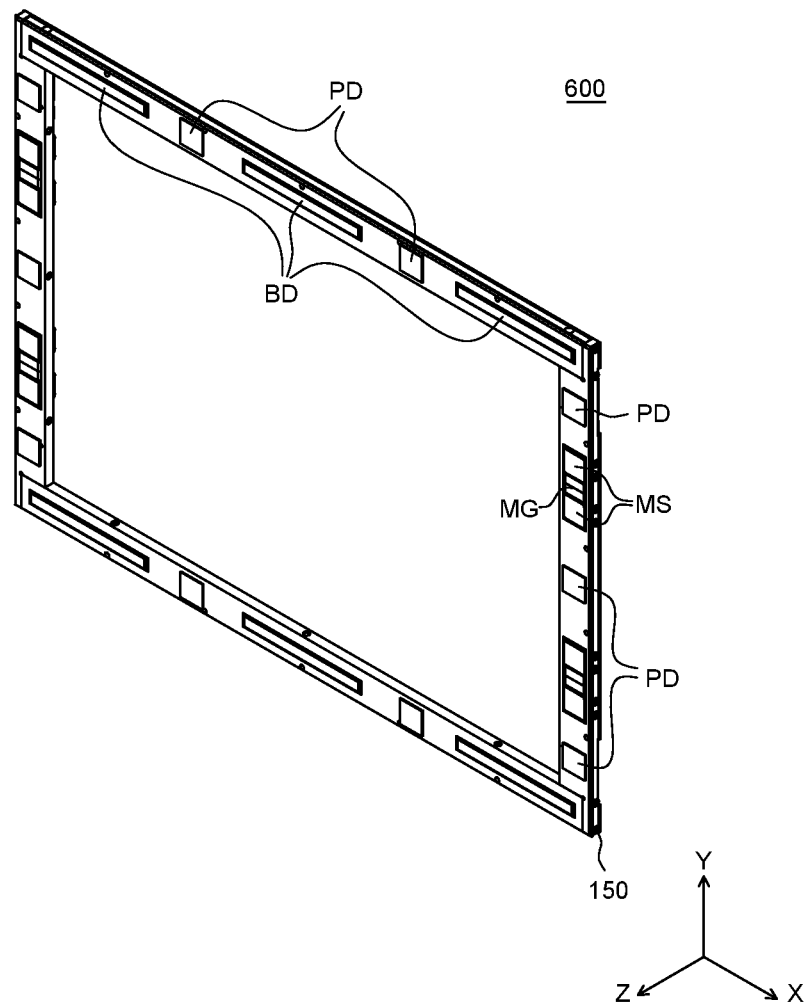
FIG. 6 is an exploded perspective view of a display device according to another exemplary embodiment of the present invention.
Figure 7A:
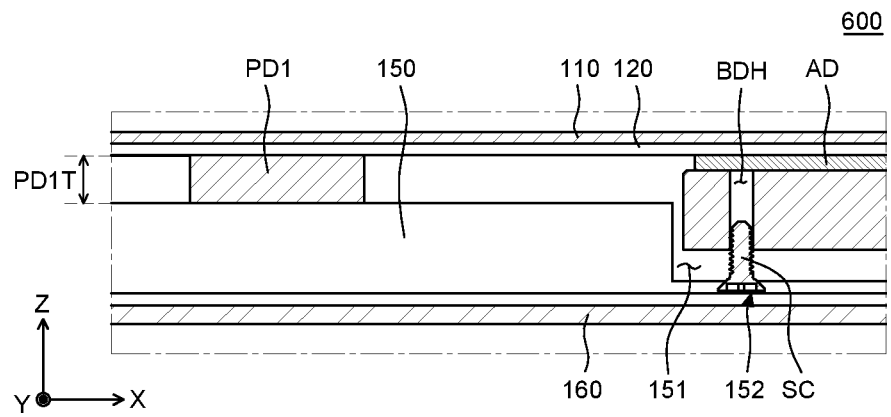
FIG. 7A and FIG. 7B are cross-sectional views of the display device according to another exemplary embodiment of the present invention.
Figure 7B:
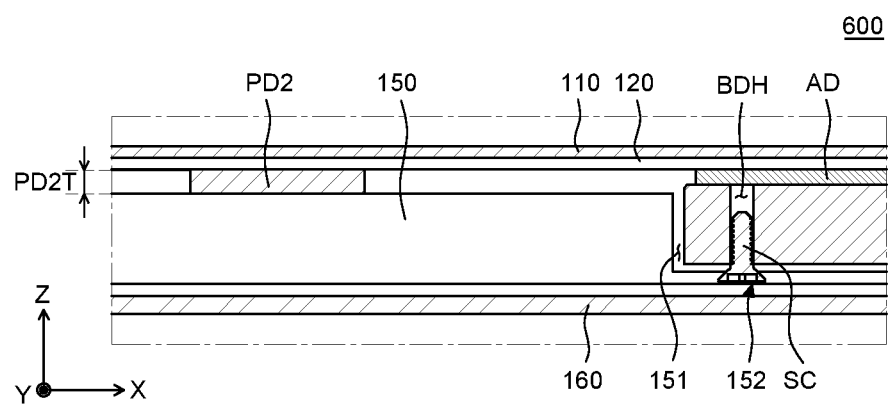

FIG. 6 is an exploded perspective view of a display device according to another exemplary embodiment of the present invention. FIG. 7A and FIG. 7B are cross-sectional views of the display device according to another exemplary embodiment of the present invention. Specifically, FIG. 6 is a perspective view as viewed from a front surface of a display device 600. For the convenience of the description, FIG. 6 illustrates only the frame 150, the plurality of binders BD, the plurality of coupling members SC, the plurality of adhesive members AD, the plurality of panel magnets MG and the plurality of panel ferromagnetic materials MS. FIG. 7A is a cross-sectional view of a first buffer pad PD1 of the display device 600 according to another exemplary embodiment of the present invention. FIG. 7B is a cross-sectional view of a second buffer pad PD2 of the display device 600 according to another exemplary embodiment of the present invention. The display device 600 according to another exemplary embodiment of the present invention has substantially the same configuration as the display device 100 illustrated in FIG. 1 through FIG. 5B except that the display device 600 further includes buffer pads PD. Therefore, no detailed description of the same configuration will be provided.

Referring to FIG. 6, a plurality of buffer pads PD is disposed between the display panel 120 and the frame 150. The plurality of buffer pads PD may be disposed along the edges of the display panel 120. Each of the plurality of buffer pads PD may be disposed between two of the plurality of binders BD. The thickness of the plurality of buffer pads PD may be changed depending on the interval between the display panel 120 and the frame 150. For example, as the interval between the display panel 120 and the frame 150 is decreased, the thickness of the plurality of buffer pads PD may be decreased by being pressed by the display panel 120 and the frame 150. The plurality of buffer pads PD may be made of a material having elasticity so that the thickness can be changed depending on the interval between the display panel 120 and the frame 150. For example, each buffer pad PD may be made of a foam pad having a plurality of pores or a rubber pad having elasticity, but is not limited thereto. For example, each of the plurality of buffer pads PD contacts both of the display panel 120 and the frame 150.

Hereinafter, for the convenience of the description, one of the plurality of buffer pads PD disposed in an area where the interval between the display panel 120 and the frame 150 is the greatest is defined as the first buffer pad PD1. Also, one of the plurality of buffer pads PD disposed in an area where the interval between the display panel 120 and the frame 150 is smallest is defined as the second buffer pad PD2. However, this is just an example and the present invention is not limited thereto.

Referring to FIG. 7A, the first buffer pad PD1 among the plurality of buffer pads PD may be a buffer pad PD disposed in the area where the interval between the display panel 120 and the frame 150 is greatest. Among the plurality of buffer pads PD, the first buffer pad PD1 may be least pressed and thus may have a greatest thickness PD1T. In a state where the first buffer pad PD1 is pressed by the frame 150 and the display panel 120, the first buffer pad PD1 may push the display panel 120 and the binder BD in a direction to be away from the frame 150. Also, the first buffer pad PD1 may push the frame 150 in a direction to be away from the display panel 120.

Among the plurality of binders BD, the binder BD adjacent to the first buffer pad PD1 may be farthest away from the bottom surfaces of the plurality of grooves 151. The first buffer pad PD1 is disposed in the area where the interval between the frame 150 and the display panel 120 is greatest. Therefore, the binder BD fixed to the display panel 120 is also farthest away from the bottom surface of the groove 151 of the frame 150 and most protruded from the groove 151.

Further, a part of the coupling member SC inserted into the fixing hole BDH of the binder BD may have the shortest length.

In this case, the first buffer pad PD1 pushes the display panel 120 away from the frame 150. Thus, the coupling member SC of which a part is inserted into the fixing hole BDH of the binder BD may be pulled toward the display panel 120. Herein, the head of the coupling member SC is disposed on the rear surface of the frame 150 and the coupling hole 152 through which the coupling member SC penetrates is smaller than the head of the coupling member SC. Thus, the head of the coupling member SC may not penetrate through the coupling hole 152 toward the display panel 120, but may be fixed to the rear surface of the frame 150. Therefore, the plurality of buffer pads PD pushes the display panel 120 and the binder BD away from the frame 150 to fix the coupling member SC in order for the screw thread of the coupling member SC not to move along the coupling hole 152.

Referring to FIG. 7B, the second buffer pad PD2 among the plurality of buffer pads PD may be a buffer pad PD disposed in the area where the interval between the display panel 120 and the frame 150 is smallest. Among the plurality of buffer pads PD, the second buffer pad PD2 may be most pressed and thus may have a smallest thickness PD2T. In a state where the second buffer pad PD2 is pressed by the frame 150 and the display panel 120, the second buffer pad PD2 may push the display panel 120 and the binder BD in a direction to be away from the frame 150. Also, the second buffer pad PD2 may push the frame 150 in a direction to be away from the display panel 120.

Among the plurality of binders BD, the binder BD adjacent to the second buffer pad PD2 may be most adjacent to the bottom surfaces of the plurality of grooves 151. The second buffer pad PD2 is disposed in the area where the interval between the frame 150 and the display panel 120 is smallest. Therefore, the binder BD fixed to the display panel 120 may be also most adjacent to the bottom surface of the groove 151 of the frame 150. Further, a part of the coupling member SC inserted into the fixing hole BDH of the binder BD may have the greatest length.

The plurality of buffer pads PD of the display device 600 according to another exemplary embodiment of the present invention fills a space formed between the display panel 120 and the frame 150 to reduce a movement of the display panel 120. For example, when the frame 150 has a low flatness, the flatness of the display panel 120 may be improved using the plurality of binders BD and the plurality of coupling members SC. Herein, when some of the binders BD are protruded to the outside of the plurality of grooves 151 to adjust the flatness of the display panel 120, a space may be formed between the display panel 120 and the frame 150. In this case, the display panel 120 may be moved due to the space. Here, the plurality of buffer pads PD may be further disposed between the frame 150 and the display panel 120 to fill the space between the frame 150 and the display panel 120. That is, the buffer pads PD disposed between the frame 150 and the display panel 120 may support the display panel 120 to suppress a movement of the display panel 120. Therefore, in the display device 600 according to another exemplary embodiment of the present invention, the buffer pads PD are disposed between the display panel 120 and the frame 150 so that a movement of the display panel 120 may be reduced.

Further, the plurality of buffer pads PD of the display device 600 according to another exemplary embodiment of the present disclosure may reduce a movement of the plurality of coupling members SC through the coupling holes 152. Specifically, the plurality of coupling members SC may penetrate through the coupling holes 152 in the rear surface of the frame 150 and parts thereof may be inserted into the fixing holes BDH of the plurality of binders BD, respectively. For example, if the plurality of coupling members SC is screws, the heads thereof may be disposed on the rear surface of the frame 150 and the screw threads may be disposed in the fixing holes BDH of the plurality of binders BD and/or in the plurality of grooves 151 of the frame 150 on a front surface of the frame 150. Here, the lengths of the parts of the plurality of coupling members SC inserted into the fixing holes BDH of the plurality of binders BD may be adjusted to adjust the flatness of the display panel 120. Only parts of the screw threads of the plurality of coupling members SC may be inserted into the fixing holes BDH of the plurality of binders BD. In this case, the other parts of the screw threads not inserted into the fixing holes BDH may be moved along the coupling holes 152. In this case, even if the lengths of the parts of the coupling members SC inserted into the fixing holes BDH of the binders BD are not adjusted, the locations of the coupling members SC are changed. Therefore, the locations of the binders BD may be changed, and it may be difficult to adjust the flatness of the display panel 120. Here, the plurality of buffer pads PD having elasticity is disposed as pressed between the display panel 120 and the frame 150 and thus may continuously apply a force to push the display panel 120 and the frame 150. That is, the display panel 120 and the binders BD fixed to the display panel 120 may be moved in a direction to be away from the frame 150 by the plurality of buffer pads PD. Also, the frame 150 may be moved in a direction to be away from the display panel 120 and the binders BD. Here, the screw threads of the plurality of coupling members SC are coupled to the fixing holes BDH of the binders BD, and, thus, the plurality of coupling members SC may be pulled in a direction to be away from the frame 150 along with the binders BD. Herein, the heads of the plurality of coupling members SC are disposed on the rear surface of the frame 150 and the coupling hole 152 is smaller than the head of the coupling member SC. Thus, the head of the coupling member SC may not penetrate through the coupling hole 152, but may be fixed to the rear surface of the frame 150. Therefore, since the buffer pads PD are disposed between the display panel 120 and the frame 150, it is possible to reduce a movement of a part of the coupling member SC, which is not inserted into the fixing hole BDH, through the coupling hole 152. Also, it is possible to easily fix the location of the binder BD.

The exemplary embodiments of the present invention can also be described as follows:

A display device according to an exemplary embodiment of the present invention includes a display panel, a frame disposed on a rear surface of the display panel, a plurality of binders fixed to the rear surface of the display panel and disposed between the display panel and the frame, and a plurality of coupling members penetrating the frame and coupled to the plurality of binders.

The frame may include a plurality of grooves into which each of a plurality of binders are inserted, and a plurality of coupling holes which communicate with the plurality of grooves and through which the plurality of coupling members penetrate.

The plurality of binders may include fixing holes which are coupled to the plurality of coupling members, the plurality of coupling members may be rotated inside the fixing holes, and the plurality of binders may move to an outside or an inside of the plurality of grooves.

One of the plurality of coupling members, which is coupled to a binder disposed in an area where a distance between the display panel and the frame is the greatest may have a shortest part disposed inside the fixing hole.

The plurality of coupling members may include a first coupling member and a second coupling member. A length of a part of the first coupling member inserted into the binder may be different from a length of a part of the second coupling member inserted into the binder.

The first coupling member may be a coupling member having a greatest interval with the display panel, and the length of the part of the first coupling member inserted into the binder among the plurality of coupling members may be shortest.

In the binder into which the first coupling member is inserted among the plurality of binders, an interval between the display panel and the frame may be greatest.

The display device may further include a buffer pad disposed between the frame and the display panel.

The display device may further include an adhesive members disposed between the plurality of binders and the display panel.

The plurality of binders may be disposed adjacent to edges of the display panel.

The display device may further include a plurality of flexible films bonded to the rear surface of the display panel, a printed circuit board electrically connected to the plurality of flexible films, and a cover shield disposed on a rear surface of the frame and covering the plurality of flexible films and the printed circuit board. The plurality of flexible films and the printed circuit board may be disposed to surround the frame.

A display device according to another exemplary embodiment of the present invention includes a display panel, a plurality of binders bonded to a rear surface of the display panel, an adhesive member which bonds the plurality of binders and the display panel, a frame disposed to cover the display panel and the plurality of binders, and a plurality of coupling members coupled to the frame and the plurality of binders. Lengths of parts of each of the plurality of coupling members in contact with the plurality of binders are different from each other.

The plurality of binders may include fixing holes into which the plurality of coupling members are inserted. When the plurality of coupling members are rotated inside the fixing holes in any one of a clockwise direction and a counter-clockwise direction, one ends of the plurality of coupling members may move to an outside of the fixing holes, and when the plurality of coupling members are rotated inside the fixing holes in the other of the clockwise direction and the counter-clockwise direction, the one ends of the plurality of coupling members may move to an inside of the fixing holes.

The frame may further include a plurality of grooves on which the plurality of binders are mounted, and a plurality of coupling holes which are disposed in bottom surfaces of the plurality of grooves and through which the plurality of coupling members penetrate. The plurality of coupling members may be coupled to the plurality of binders with the frame interposed therebetween.

The display device may further include a plurality of buffer pads disposed between the frame and the display panel. The plurality of buffer pads may be different in thickness from each other.

One buffer pad overlapping an area corresponding to one binder which is farthest away from bottom surfaces of the plurality of grooves among the plurality of binders may be thickest.

The frame may have a shape corresponding to edges of the display panel, and long sides of the plurality of binders may be disposed along the edges of the display panel.

Although the exemplary embodiments of the present invention have been described in detail with reference to the accompanying drawings, the present invention is not limited thereto and may be embodied in many different forms without departing from the technical concept of the present invention. Therefore, the exemplary embodiments of the present invention are provided for illustrative purposes only but not intended to limit the technical concept of the present invention. The scope of the technical concept of the present invention is not limited thereto. Therefore, it should be understood that the above-described exemplary embodiments are illustrative in all aspects and do not limit the present invention. The protective scope of the present invention should be construed based on the following claims, and all the technical concepts in the equivalent scope thereof should be construed as falling within the scope of the present invention.

The invention claimed is:

1. A display device, comprising:
   a display panel;
   a frame disposed on a rear surface of the display panel;
   a plurality of binders fixed to the rear surface of the display panel and disposed between the display panel and the frame;
   a plurality of coupling members penetrating the frame and coupled to the plurality of binders; and
   a buffer pad disposed between the frame and the display panel,
   wherein the frame includes a plurality of grooves into which the plurality of binders are inserted, and
   wherein a thickness of the buffer pad without being pressed is greater than a thread portion of the coupling member.

2. The display device of claim 1, wherein the frame further includes:
   a plurality of coupling holes which communicate with the plurality of grooves and through which the plurality of coupling members penetrate.

3. The display device of claim 2, wherein the plurality of binders include a plurality of fixing holes which are coupled to the plurality of coupling members,
   the plurality of coupling members are rotated inside the plurality of fixing holes, and
   the plurality of binders move to an outside or an inside of the plurality of grooves by rotating the plurality of coupling members.

4. The display device of claim 3, wherein one of the plurality of coupling members, which is coupled to a binder disposed in an area where a distance between the display panel and the frame is the greatest, has a shortest part disposed inside the fixing hole.

5. The display device of claim 2, wherein the plurality of coupling members include a first coupling member and a second coupling member, and
   wherein a length of a part of the first coupling member inserted into the binder is different from a length of a part of the second coupling member inserted into the binder.

6. The display device of claim 5, wherein the first coupling member is a coupling member having a greatest interval with the display panel, and the length of the part of the first coupling member inserted into the binder among the plurality of coupling members is shortest.

7. The display device of claim 6, wherein in the binder into which the first coupling member is inserted among the plurality of binders, an interval between the display panel and the frame is greatest.

8. The display device of claim 2, wherein heads of the plurality of coupling members are in contact with a rear surface of the frame, and the plurality of coupling holes have a smaller size than the heads of the plurality of coupling members.

9. The display device of claim 1, further comprising:

an adhesive members disposed between the plurality of binders and the display panel.

10. The display device of claim 1, wherein the plurality of binders are disposed adjacent to edges of the display panel.

11. The display device of claim 1, further comprising:

a plurality of flexible films bonded to the rear surface of the display panel;

a printed circuit board electrically connected to the plurality of flexible films; and a cover shield disposed on a rear surface of the frame and covering the plurality of flexible films and the printed circuit board, wherein the plurality of flexible films and the printed circuit board are disposed outside of the frame.

12. The display device of claim 1, wherein the buffer pad contacts both of the frame and the display panel.

13. The display device of claim 1, wherein the buffer pad is made of a material having elasticity so that a thickness of the buffer pad is changed depending on an interval between the display panel and the frame.

14. The display device of claim 13, wherein the buffer pad pushes the display panel and the binder in a direction away from the frame, so that a head of each of the plurality of coupling members is in contact with a rear surface of the frame.

15. The display device of claim 1, wherein each of the plurality of coupling members is configured to adjust a distance between the display panel and the frame at a position corresponding to the coupling member.

16. The display device of claim 1, wherein a head of each of the plurality of coupling members is in contact with a rear surface of the frame.

17. The display device of claim 1, wherein the plurality of coupling members are coupled to the plurality of binders through a screw coupling, so that a length of a part of the coupling member inserted into the binder is adjustable by rotating the coupling member.

18. A display device, comprising:

a display panel;

a plurality of binders bonded to a rear surface of the display panel;

a frame disposed to overlap the display panel and the plurality of binders; and a plurality of coupling members coupled to the frame and the plurality of binders, wherein lengths of parts of each of the plurality of coupling members in contact with the plurality of binders are different from each other, and wherein the frame further includes a plurality of grooves in which the plurality of binders are mounted.

19. The display device of claim 18, wherein the plurality of binders include a plurality of fixing holes into which the plurality of coupling members are inserted, wherein when the plurality of coupling members are rotated inside the plurality of fixing holes in one of a clockwise direction and a counter-clockwise direction, one ends of the plurality of coupling members move to an outside of the plurality of fixing holes, and when the plurality of coupling members are rotated inside the plurality of fixing holes in the other of the clockwise direction and the counter-clockwise direction, the one ends of the plurality of coupling members move to an inside of the plurality of fixing holes.

20. The display device of claim 18, wherein the frame further includes:

a plurality of coupling holes which are disposed in bottom surfaces of the plurality of grooves and through which the plurality of coupling members penetrate, wherein the plurality of coupling members are coupled to the plurality of binders with the frame interposed therebetween.

21. The display device of claim 20, further comprising:

a plurality of buffer pads disposed between the frame and the display panel, wherein the plurality of buffer pads are different in thickness from each other.

22. The display device of claim 21, wherein one buffer pad overlapping an area corresponding to one binder which is farthest away from bottom surfaces of the plurality of grooves among the plurality of binders is thickest among the plurality of buffer pads.

23. The display device of claim 18, wherein the frame has a shape corresponding to edges of the display panel, and long sides of the plurality of binders are disposed along the edges of the display panel.

* * * * *